United States Patent
Maebashi et al.

(10) Patent No.: US 9,084,349 B2
(45) Date of Patent: Jul. 14, 2015

(54) ELECTRIC CONNECTION BOX

(75) Inventors: Akemi Maebashi, Shizuoka (JP); Masanobu Suzuki, Aichi (JP)

(73) Assignee: Yazaki Corporation, Tokyo (JP)

( * ) Notice: Subject to any disclaimer, the term of this patent is extended or adjusted under 35 U.S.C. 154(b) by 883 days.

(21) Appl. No.: 12/654,058

(22) Filed: Dec. 9, 2009

(65) Prior Publication Data

US 2010/0155134 A1 Jun. 24, 2010

(30) Foreign Application Priority Data

Dec. 22, 2008 (JP) .................. 2008-325116
Oct. 15, 2009 (JP) .................. 2009-237997

(51) Int. Cl.
*H05K 5/00* (2006.01)
*H05K 5/02* (2006.01)

(52) U.S. Cl.
CPC .............. *H05K 5/023* (2013.01); *H05K 5/0047* (2013.01)

(58) Field of Classification Search
CPC ........................... H05K 5/023; H05K 5/0047
USPC .......................... 174/520, 544, 559; 439/76.2
See application file for complete search history.

(56) References Cited

U.S. PATENT DOCUMENTS

| | | | | |
|---|---|---|---|---|
| 4,940,419 A | * | 7/1990 | Kurita et al. | 439/271 |
| 5,139,153 A | * | 8/1992 | Delamare et al. | 206/594 |
| 5,488,575 A | * | 1/1996 | Danielson et al. | 713/321 |
| 6,541,700 B2 | * | 4/2003 | Chiriku et al. | 174/50 |
| 6,828,500 B2 | * | 12/2004 | Wagner | 174/17 VA |
| 6,922,332 B2 | * | 7/2005 | Naimi et al. | 361/641 |
| 8,063,319 B2 | * | 11/2011 | Miyamoto | 174/541 |
| 2005/0056444 A1 | * | 3/2005 | Murata | 174/50 |
| 2005/0176276 A1 | * | 8/2005 | Saka et al. | 439/76.2 |
| 2006/0109615 A1 | * | 5/2006 | Kunimoto et al. | 361/679 |
| 2009/0023313 A1 | * | 1/2009 | Hayakawa | 439/76.2 |

FOREIGN PATENT DOCUMENTS

JP 11-032412 A 2/1999

* cited by examiner

*Primary Examiner* — Hung V Ngo
(74) *Attorney, Agent, or Firm* — Locke Lord LLP

(57) ABSTRACT

The electric connection box includes a case receiving various electric components, like a relay, a fuse, and a connector. The case includes a low-height area with a lower height about height than other area of the case. A plurality of ribs forming a grid shape by intersecting to each other is provided on a bottom surface of the low-height area.

4 Claims, 5 Drawing Sheets

ELECTRIC CONNECTION BOX

The priority application Number Japan Patent Application 2008-325116 upon which this patent application is based is hereby incorporated by reference.

BACKGROUND OF THE INVENTION

1. Field of the Invention

This invention relates to an electric connection box, arranged in an engine room of a car.

2. Description of the Related Art

In a car, various electronic equipments are mounted. An electric connection box, which is structured integrally with electric components, such as fuses and relays, is arranged at a suitable location between a power supply and the electronic equipments in the car for supplying electric power to the various electronic equipments.

The electric connection box may be described by the name of a junction block, a fuse block and a relay box. In this specification, the junction block, the fuse block and relay box are described with an electric connection box as a generic name hereafter. FIG. 4 is a sectional view of an electric connection box by prior art.

The electric connection box includes generally a plurality of electric components, and a case made of synthetic resin, in which the plurality of electric components is received (for example, it is shown in Japan Patent Published H11-32412).

SUMMARY OF THE INVENTION

Objects to be Solved

In the electric connection box by Prior Art, an outer surface of a case is formed into a smooth flat shape so that the case is easily slipped. Thereby, there is a problem that the electric connection box would be slipped down from one hand when the electric connection box is held by the one hand.

According to the above problems, an object of the present invention is to provide an electric connection box, which can be prevented from being slipped down from a worker's hand when the electric connection box is attach to a car body.

How to Attain the Object of the Present Invention

In order to overcome the above problems and attain the object of the present invention, an electric connection box according to the present invention includes a case receiving various electric components, and the case has a plurality of ribs intersecting to each other on an outer surface of the case so as to form a grid shape.

In the electric connection box according to the present invention, the case has a low-height area lower than other area of the case about height, and the plurality of ribs is provided on an outer surface of the low-height area.

An electric connection box according to the present invention includes a case receiving various electric components, and the case has a low-height area lower than other area about height, and projections are provided on an outer surface of the lower-height area.

Effects of the Invention

According to the present invention, since the case has a plurality of ribs intersecting to each other on an outer surface of the case so as to form a grid shape, a worker can hold the electric connection box by touching the ribs when attaching the electric connection box to the car body so that it can be prevented that the electric connection box is slipped down from the worker's hand. The plurality of ribs is provided so as to intersect to each other like a grid shape, so that, even if the electric connection box is held at any direction, any ribs touch the worker's hand and it can be prevented that the electric connection box is slipped down from the worker's hand.

In the electric connection box according to the present invention, the case has the low-height area lower than other area about height, and the ribs are provided on the outer surface of the low-height area, so that the worker can hold the electric connection box to touch the ribs at the low-height area, which can be easily received in a hand, and it can be securely prevented that the electric connection box is slipped down from the worker's hand.

In the electric connection box according to the present invention, the case receiving various electric components has the low-height area lower than other area about height, and projections are provided on the outer surface of the low-height area, so that, the worker can hold the electric connection box to touch the umbones at the low-height area, which can be easily received in a hand, and it can be securely prevented that the electric connection box is slipped down from the worker's hand.

The above and other objects and features of this invention will become more apparent from the following description taken in conjunction with the accompanying drawings.

DESCRIPTION OF THE PREFERRED EMBODIMENT

First Embodiment

Figure 1:
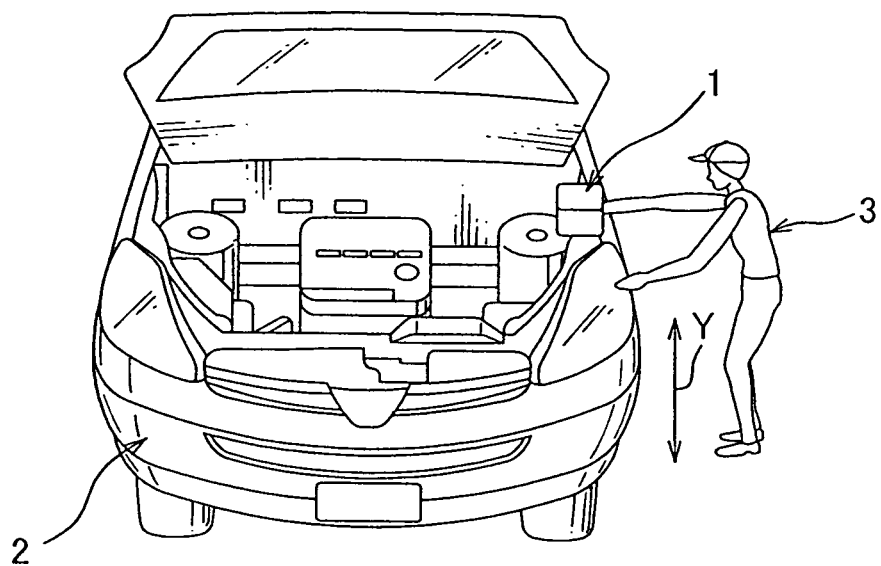
FIG. 1 is an illustration of attaching an electric connection box of a first embodiment according to the present invention to an engine room of a car by a worker.
Figure 2:
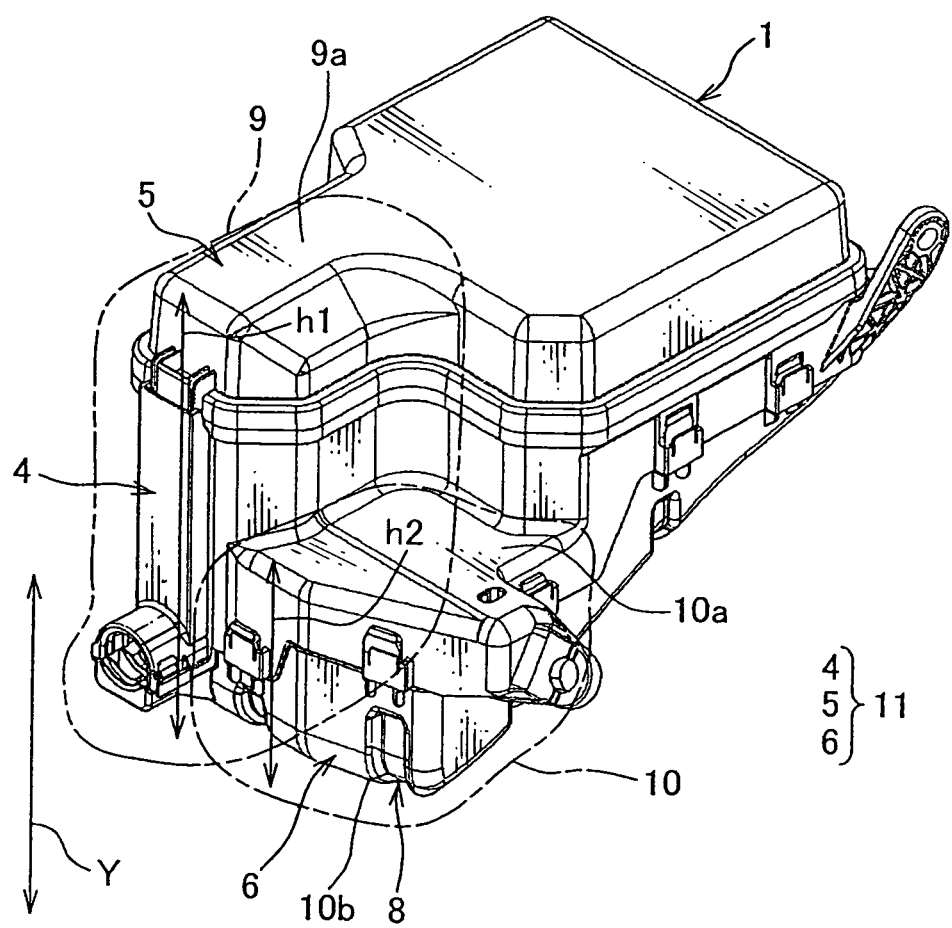
FIG. 2 is a perspective view of the electric connection box shown in FIG. 1.
Figure 3:
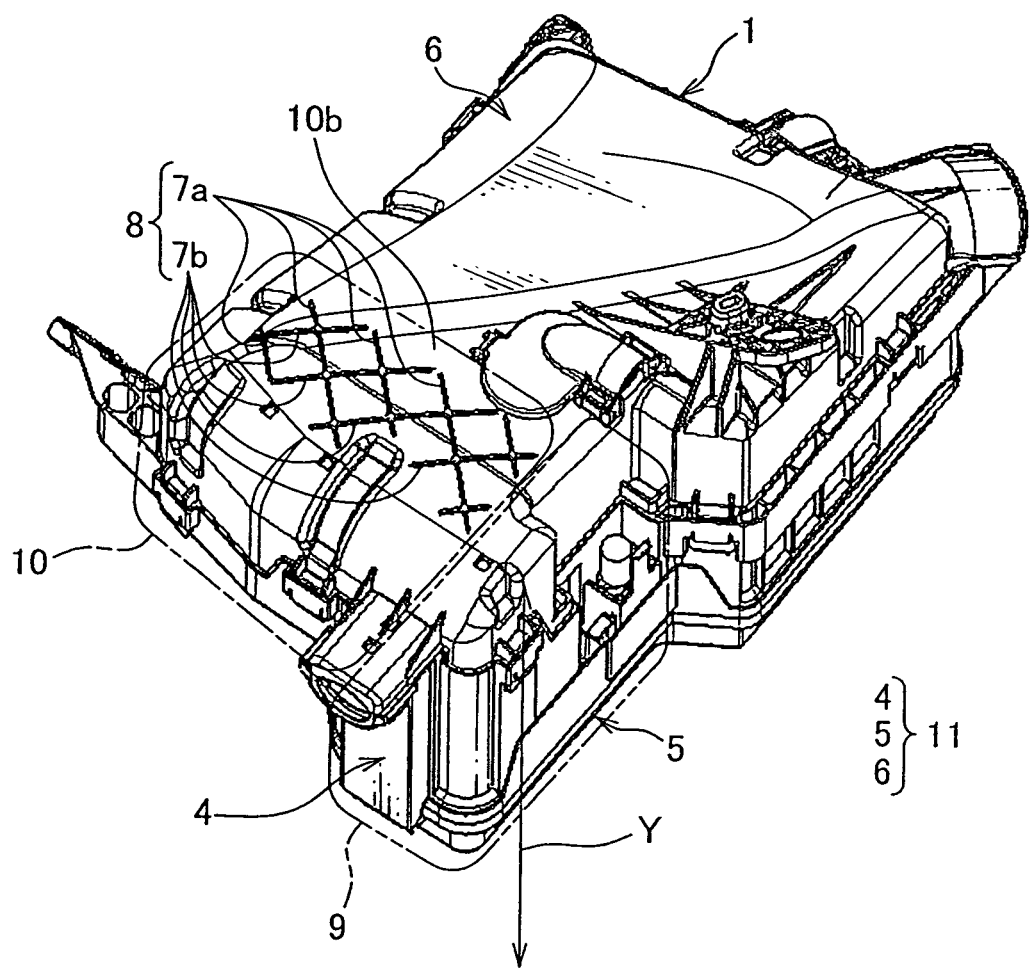
FIG. 3 is a perspective view of the electric connection box shown in FIG. 2 when viewed from a bottom side thereof.
Figure 4:
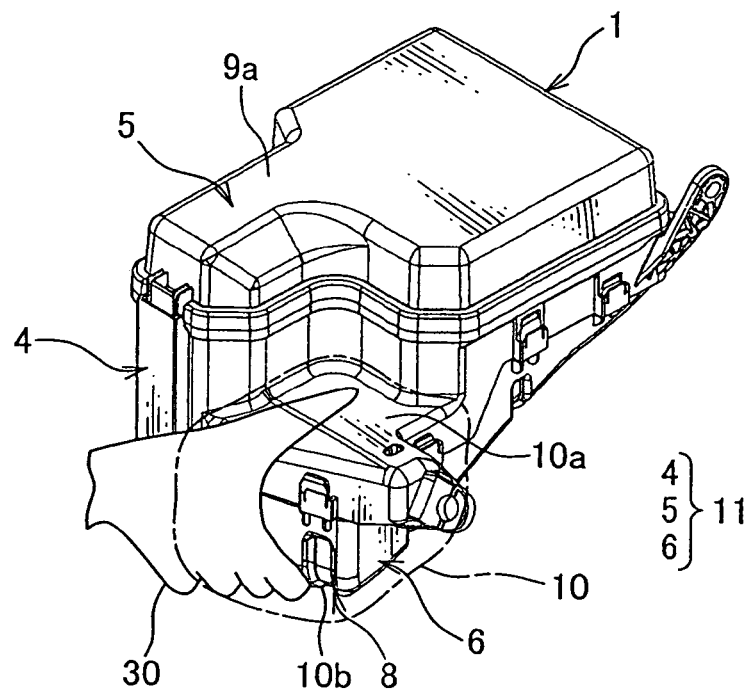
FIG. 4 is an illustration showing a way of holding the electric connection box shown in FIG. 1 when attaching the electric connection box to the car.
Figure 5:
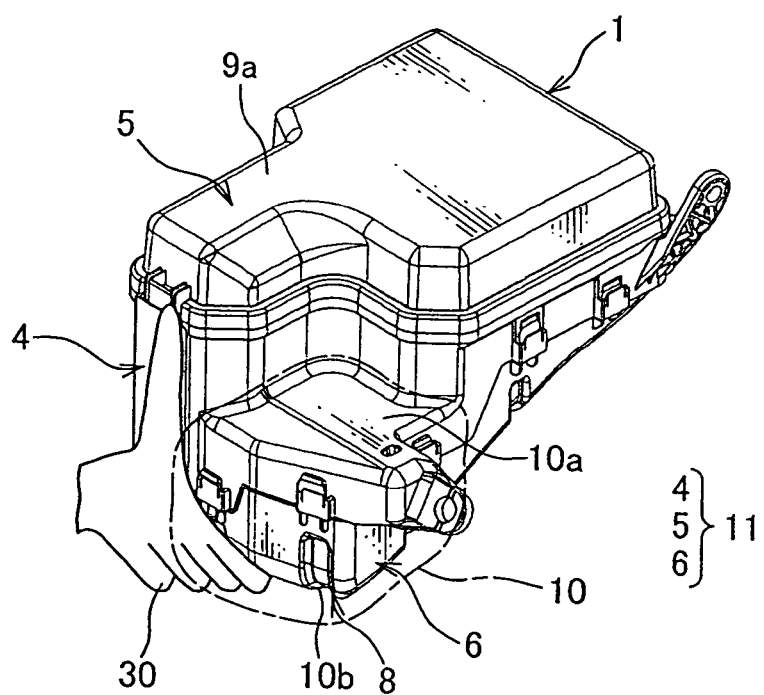
FIG. 5 is an illustration showing another way of holding the electric connection box shown in FIG. 1 when attaching the electric connection box to the car.

An electric connection box of a first embodiment according to the present invention will be described with reference to FIGS. 1-5. FIG. 1 is an illustration of attaching the electric connection box of the first embodiment to an engine room of a car. FIG. 2 is a perspective view of the electric connection box shown in FIG. 1. FIG. 3 is a perspective view of the electric connection box shown in FIG. 2 when viewed from a bottom side of the electric connection box. FIG. 4 is an illustration showing a way of holding the electric connection box when attaching the electric connection box to the car. FIG. 5 is an illustration showing another way of holding the electric connection box shown in FIG. 1 when attaching the electric connection box to the car.

The electric connection box 1 is attached to the engine room of the car by the worker 3 as shown in FIG. 1 so as to supply electric power to various electronic equipments mounted at the car. In this description, a junction block, a fuse block and a relay box are called the electric connection box as a generic name. An arrow Y in FIG. 1 shows a direction from a floor of the car 2 toward a roof of the car 2.

The electric connection box 1 includes a case main body 4 made of synthetic resin, in which various electric components (not shown) like a relay, a fuse and a connector; an upper cover 5, made of synthetic resin, covering an upper surface of the case main body 4; and a lower cover 6, mad of synthetic resin, covering a bottom surface of the case main body 4, as shown in FIGS. 2, 3. A case 11 of the present invention is formed with the case main body 4, the upper cover 5 and the lower cover 6.

The case 11 has a top-height area 9 with a highest height h1 along an arrow Y shown in FIG. 2 (shown by surrounding with a chain double-dashed line) and a low-height area 10 with a lower height $h_2$ along the arrow Y than the highest height h1 of the top-height area 9 (shown by surrounding with a dashed line). The top-height area 9 and the low-height area 10 are arranged at positions adjacent to each other in a direction perpendicular to the arrow Y. Thus, a top surface 9a of the top-height area 9 has a step against a top surface 10a of the top-height area 10.

A bottom surface 10b corresponding in the arrow Y to the top surface 10a of the low-height area 10 as an outer surface of the case 11 is provided with an anti-slip member 8 as shown in FIG. 3. The anti-slip member 8 is structured as projections with a plurality of ribs 7a arranged at intervals in parallel to each other and a plurality of ribs 7b arranged at intervals in parallel to each other so as to form a grid shape by arranging the ribs 7a and 7b intersecting to each other.

A way of handling the electric connection box 1 for attaching the electric connection box 1 to the engine room of the car 2 will be described with reference to FIGS. 1, 4 and 5.

When the electric connection box 1 is attached to the engine room of the car 2, a thumb of a hand 30 of the worker 3 is put on the top surface 10a of the low-height area 10, and remained fingers other than the thumb are put on the bottom surface 10b of the low-height area 10 so as to hold the low-height area 10 by touching the ribs 7a and 7b of the anti-slip member 8. By placing the electric connection box 1 at the engine room of the car 2, and by screwing bolts by the other hand of the worker 3, the electric connection box 1 is attached to the engine room.

According to the present invention, by holding the electric connection box 1 by touching the ribs 7a, 7b of the anti-slip member 8 by the worker 8, it can be prevented that the electric connection box 1 is slipped down from the hand 30 of the worker 3.

According to the present invention, the plurality of ribs 7a and the plurality of ribs 7b are formed into the grid shape by intersecting to each other. Therefore, whenever the electric connection box 1 is held from any angle by the hand, some ribs 7a, 7b can touch the fingers of the hand 30, so that it can be prevented that the electric connection box 1 is slipped down from the hand 30 of the worker 3.

According to the present invention, the low-height area 10 with the lower height $h_2$ than the other area to be received easily in the hand 30 of the worker 3 is provided. On the outer surface, that is the bottom surface 10b, of the low-height area 10, the anti-slip member 8 is provided. By holding the low-height area 10 with touching the ribs 7a, 7b of the anti-slip member 8, it can be more securely prevented that the electric connection box 1 is slipped down from the hand 30 of the worker 3.

When the electric connection box 1 is attached to the engine room of the car 2, the thumb of the one hand 30 of the worker 3 may be put on a side surface of the case main body 4 as shown in FIG. 5, and the fingers other than the thumb are put on the bottom surface 10b of the low-height area 10, so that the electric connection box 1 can be held with touching the ribs 7a, 7b of the anti-slip member 8 by the fingers. By placing the electric connection box 1 at the engine room of the car 2, and by screwing the bolts by the other hand of the worker 3, the electric connection box 1 can be attached to the engine room.

According to the present invention, the anti-slip member 8, that is the plurality of ribs 7a and the plurality of ribs 7b, can be provided on any outer surface of the case 11 other than the above embodiment.

Figure 6:
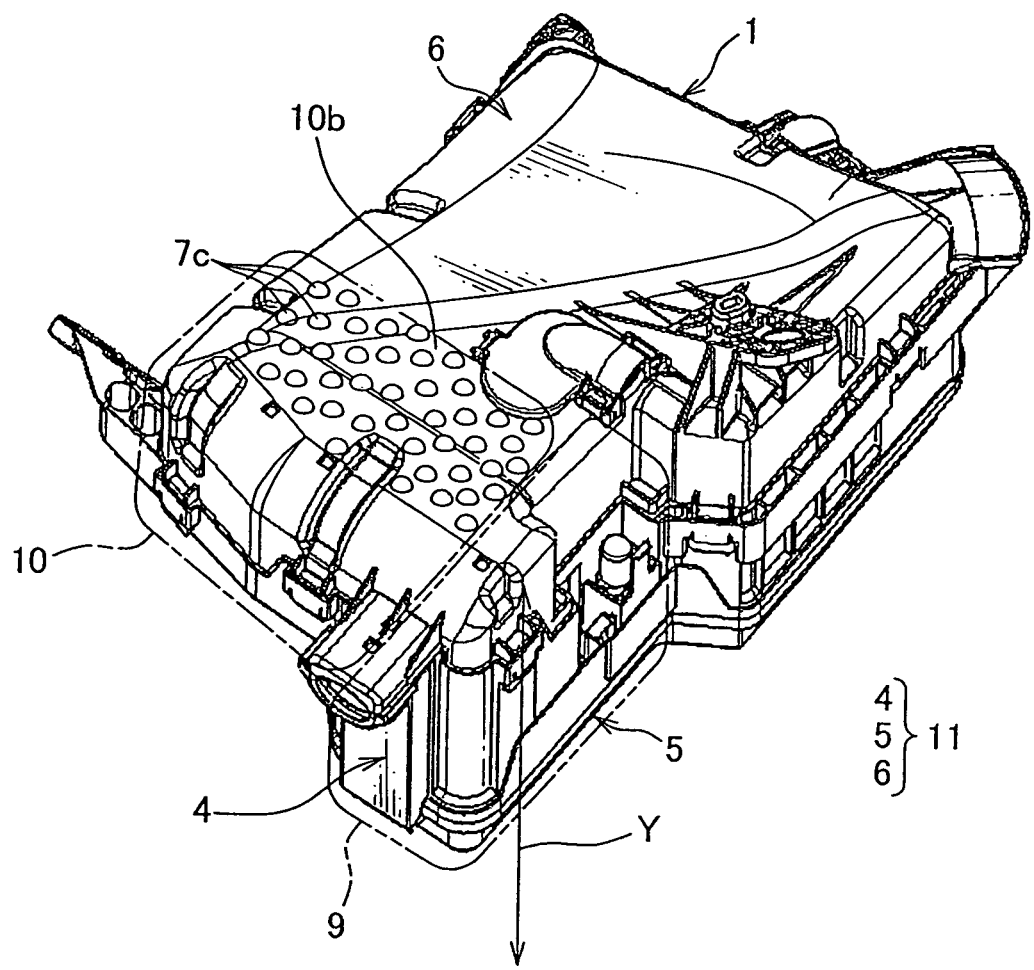
FIG. 6 is a perspective view of other embodiment of the electric connection box shown in FIG. 3.

According to the present invention, instead of the ribs 7a, 7b mentioned above, for example, a plurality of half-dome-shaped projections 7c can be provided as shown in FIG. 6, or a plurality of conical-shaped projections (not shown) can be provided as anti-slip projections. Thus, projections in the present invention correspond to protrusions projecting from the outer surface of the low-height area 10 of the case 11, such as the plurality of ribs 7a, 7b or the plurality of projections 7c.

While, in the embodiment, the present invention is described, it is not limited thereto. Various change and modifications can be made with the scope of the present invention.

The invention claimed is:

1. An electric connection box, comprising:
   a case receiving various electric components therein, the case comprising a low-height area lower than other area of the case in height, the low-height area defining at least a part of a graspable portion of the electric connection box; and
   a graspable anti-slip member arranged on a bottom surface of the low-height area,
   wherein the case comprises: a case main body; an upper cover covering an upper surface of the case main body; and a lower cover covering a bottom surface of the case main body, and
   wherein the low-height area, which top surface is uneven to a top surface of the other area, is constituted by parts of the case main body and the lower cover.

2. The electric connection box according to claim 1, wherein the case comprises a case main body, an upper cover covering an upper surface of the case main body, and a lower cover covering a bottom surface of the case main body, and wherein the low-height area in which a plurality of ribs and/or projections is arranged is a part of at least one outer surface of the lower cover.

3. The electric connection box according to claim 1, wherein a top surface of the other area has a step against a top surface of the low-height area and a bottom surface of the case has no step.

4. The electric connection box according to claim 1, wherein the anti-slip member is structured as projections with a first plurality of ribs arranged at intervals parallel to each other and a second plurality of ribs arranged at intervals parallel to each other so as to form a grid shape by arranging the first plurality of ribs and the second plurality of ribs to intersect each other.

* * * * *